US005469093A

United States Patent [19]

MacDonald

[11] Patent Number: 5,469,093

[45] Date of Patent: Nov. 21, 1995

[54] CURRENT MIRROR DRIVE CIRCUIT WITH HIGH BREAKDOWN VOLTAGE

[75] Inventor: Iain R. MacDonald, Renfrewshire, United Kingdom

[73] Assignee: Plessey Semiconductors Limited, United Kingdom

[21] Appl. No.: 333,264

[22] Filed: Nov. 2, 1994

[30] Foreign Application Priority Data

Nov. 3, 1993 [GB] United Kingdom .................. 9322699

[51] Int. Cl.$^6$ ........................................ H03B 1/00

[52] U.S. Cl. ......................... 327/108; 327/103; 330/295; 330/299; 330/311

[58] Field of Search .................................. 323/311, 315; 327/103, 108–111, 315, 403, 404, 405, 407, 408, 419, 427, 488, 490; 330/257, 288, 295, 299, 311

[56] References Cited

FOREIGN PATENT DOCUMENTS

0353742A2 2/1990 European Pat. Off. .

*Primary Examiner*—John S. Heyman

*Assistant Examiner*—Jeffrey Zweizig

*Attorney, Agent, or Firm*—Kirschstein et al.

[57] ABSTRACT

A drive circuit comprises a plurality of current mirrors connected in series at their output-current end with a load resistor between two power rails. The input halves of the mirrors are driven by respective groups of series-connected input transistors, the lowest transistor in each group serving to set up the required currents in the mirrors in response to an input voltage on its base. Two potential dividers set up potentials on the control terminals of the groups of input transistors, on the one hand, and potentials on the main-terminal junctions of the mirror output transistors, on the other, such that at no time does any transistor in the circuit experience a voltage greater than its rated voltage.

13 Claims, 2 Drawing Sheets

CURRENT MIRROR DRIVE CIRCUIT WITH HIGH BREAKDOWN VOLTAGE

BACKGROUND OF THE INVENTION

The invention concerns a drive circuit, and in particular a varactor line drive circuit for integration into a synthesizer circuit.

The use of varactor tuning in frequency synthesizers is well known and conventionally requires that the varactor (a varicap diode exhibiting a capacitance inversely proportional to the magnitude of the reverse-bias voltage across it) be driven by a synthesizer stage via a drive transistor external to that stage. A typical scheme is shown in FIG. 1, in which a synthesizer stage 20 drives the varactor input 31 of a tuner stage 30 by means of an external drive transistor 32 in conjunction with a load resistor 33 coupled to a high-voltage supply 34. Instructions are passed from a control microprocessor 40 along an PC bus 41 to the synthesizer 20 to select the desired channel frequency in the tuner 30. These instructions are compared with the actual frequency of the tuner oscillator 33, which is conveyed along a line 38 to the synthesizer stage 20, to provide an error signal in the synthesizer stage. This error signal is then used to bring the frequency of the oscillator 33 nearer to the required frequency by arranging for it to vary the signal on the base of the drive transistor 32. The resulting variation in the collector voltage of transistor 32 causes the reverse bias on the varicap 34 to change, and it is this change in reverse bias which brings about a corresponding change in the capacitance of the varicap 34, thereby adjusting the frequency of the oscillator 33 to the required frequency. Finally, the correctly adjusted oscillator signal in the tuner 30 is mixed with an incoming RF signal from an antenna 35 in a mixer 36 to produce an output IF signal on a line 37.

It is a common requirement in the art to be able to integrate as many functions as possible onto one chip. However, up till now, considerable problems have beset the designer who wished to integrate a drive transistor such as that shown as transistor 32 in FIG. 1 into an integrated stage such as the synthesizer stage 20 shown in the same figure. This is because the varactor drive circuit is required to operate at anywhere up to 35 volts, although the breakdown voltages inherent in the manufacturing process used for the synthesizer stage 20 are only in the region of 10–20 volts, depending on which junction in the produced chip is being used as a reference.

SUMMARY OF THE INVENTION

According to the invention, there is provided a drive circuit comprising first and second power supply rails; a plurality of output transistors, each output transistor having first and second main terminals and a control terminal, said output transistors being connected in series at their main terminals between the first and second power supply rails by way of a load element; a like plurality of driving circuit means for applying driving signals to said control terminals of respective output transistors in dependence upon respective input currents to said driving circuit means, said driving circuit means being arranged such as to allow the respective output transistor control terminal to float in dependence upon an output voltage established across said load element; a like plurality of input means arranged to establish an input current in respective ones of said driving circuit means in dependence upon an input signal to said drive circuit, thereby to establish a desired output voltage across said load element, each of said input means comprising at least one input transistor having first and second main terminals and a control terminal; first and second biasing means connected between said first and second power supply rails, and means connecting said first and second biasing means to said output transistors and to input transistors within said input means, respectively, to apply to said main terminals of said output transistors, and to said main terminals of said input transistors, respectively, voltages intermediate those of said first and second power supply rails, such that voltages appearing across the main terminals of the respective transistors are less than a rated voltage for said transistors.

Use of more than one output transistor and input transistor enables the high supply voltage, nominally 30 V, to be shared between transistors within those sets of transistors. Further, by providing biasing for the transistors concerned it is possible to control the degree of sharing which occurs.

Each of said driving circuit means may comprise a driving transistor connected to its respective output transistor in a current-mirror configuration.

The load element may be connected to the second power supply rail and each of said input means may comprise a group of input transistors connected in series at their main terminals. Thus, both the output transistors and the groups of input transistors may be configured as a totem pole arrangement in each case. Each of said groups of input transistors may be connected at one end to its respective driving transistor and at the other end to the second power supply rail, the combinations of input transistor group and current mirror being arranged such that the output transistors of successive current mirrors, starting from the mirror nearest the first power supply rail, pass successively less current.

The use of current mirrors allows current set up in the input transistors by an applied drive-circuit input to be reflected into the load element, the drive-circuit input and the load element being referred to the same supply rail. The use of groups of series-connected input transistors allows adequate voltage sharing to take place between those elements. The higher mirror output currents that are passed higher up the mirror chain towards the first power supply rail feed the sum of the mirror output and mirror input currents of successive mirrors going down the chain, any excess currents being taken up by the first divider chain.

Successive groups of series-connected input transistors, starting from the group associated with the current mirror nearest the load element, may comprise successively one more input transistor.

Those input transistors which are connected to the second power supply rail may be commoned together at their control terminals, the commoned control terminals forming an input of the drive circuit for receiving the input signal. Corresponding remaining transistors in the groups of input transistors may also have their control terminals commoned together and connected to the second biasing means.

The first and second biasing means may comprise first and second potential divider chains, respectively, the first divider chain having a plurality of dividing elements corresponding to the plurality of output transistors, the plurality of dividing elements forming corresponding tapping points, the tapping points being connected to respective main-terminal junctions of the plurality of output transistors, and the second divider chain having a plurality of dividing elements corresponding to the number of series-connected input transistors in the largest group of input transistors, the plurality of dividing elements forming corresponding tapping points, the tapping points being connected to respective commoned control terminals of the groups of input transistors.

Use of potential dividers allows accurately controlled tapping-point potentials to be established, which in turn makes for reliable control of the voltages appearing across the input and output transistors. In addition, by commoning the control terminals of corresponding input transistors within the groups of input transistors, only one potential divider chain need be used for the entire complement of input transistors.

Those input transistors which are connected to the second power supply rail may be connected to that rail by way of respective resistive impedances. This reduces the sensitivity of the output-transistor current to the input signal applied to the input terminal of the drive circuit, thereby allowing more accurate control of the load-element current to be achieved. Alternatively, the drive circuit may be current-driven by arranging for the commoned control terminals of those input transistors nearest the second power supply rail to form the output-current half of a further current mirror.

There is also the advantage that, by employing three different-value resistors in this position, the current through each group of input transistors can be independently determined.

The input transistors, the driving transistors and the output transistors may be bipolar transistors. The driving transistors and the output transistors may be bipolar transistors of one polarity type, while the input transistors may be bipolar transistors of the opposite polarity type.

Use of bipolar transistors for these elements enables a predictable circuit voltage analysis to be performed, thereby enabling the circuit to maintain the voltages across the various elements, i.e. the $V_{CE}$'s, to within their rated value.

The drive circuit may comprise three current mirrors. By employing three current mirrors in a circuit designed to work with a high-voltage rail of around 30 V, the $V_{CE}$'s of the various transistors in the circuit can be limited to 10 V or less, which allows an adequate safety margin in a typical manufacturing process yielding devices with a breakdown voltage of approximately 12 V. Equal voltage division can be ensured, in particular under no-signal conditions at the drive-circuit input, by arranging for the dividing elements in the first divider chain to be of equal impedance value, and likewise the dividing elements in the second divider chain.

Where higher voltages than the nominal 30–35 V are envisaged, there may be more than three current mirrors.

The successively greater mirror output currents that are required in successive mirrors starting from the mirror nearest the load element can be obtained either by arranging for respective input-transistor groups to provide successively more current, or by arranging for the mirrors to have a successively greater ratio of mirror output current to mirror input current, or by a combination of both. These current ratios are conveniently set in a bipolar mirror by arranging for the two transistors in the mirror to have the required relative emitter areas, the device which is to pass the higher current having the greater area. Where successively greater mirror ratios are used, it may in some circumstances be necessary to employ current mirrors having very high ratios of emitter area. It is, for example, advantageous if the emitter ratios for a three-mirror circuit be made 40:1, 30:1 and 20:1, respectively, for the mirrors in sequence starting from the mirror nearest the first voltage supply rail. This assumes equal currents in the input-transistor groups. The effect of this is to allow complete saturation of the mirror output transistors, which in turn allows the output voltage of the drive circuit (the voltage across the load element) almost to reach the first supply rail. The actual current ratios achieved in practice are less than these emitter ratios because of the relatively low value of current gain ($\beta$=20–40) inherent in the pnp devices obtained with the integration process envisaged; hence the need for such high theoretical ratios. However, ratios less than these may be employed if complete saturation is not required, the minimum being 3:1, 2:1 and 1:1, respectively, where equal currents are chosen for the input transistors.

BRIEF DESCRIPTION OF THE DRAWINGS

An embodiment of the invention will now be described, by way of example only, with reference to the drawings, of which.

DETAILED DESCRIPTION OF THE INVENTION

Figure 1:
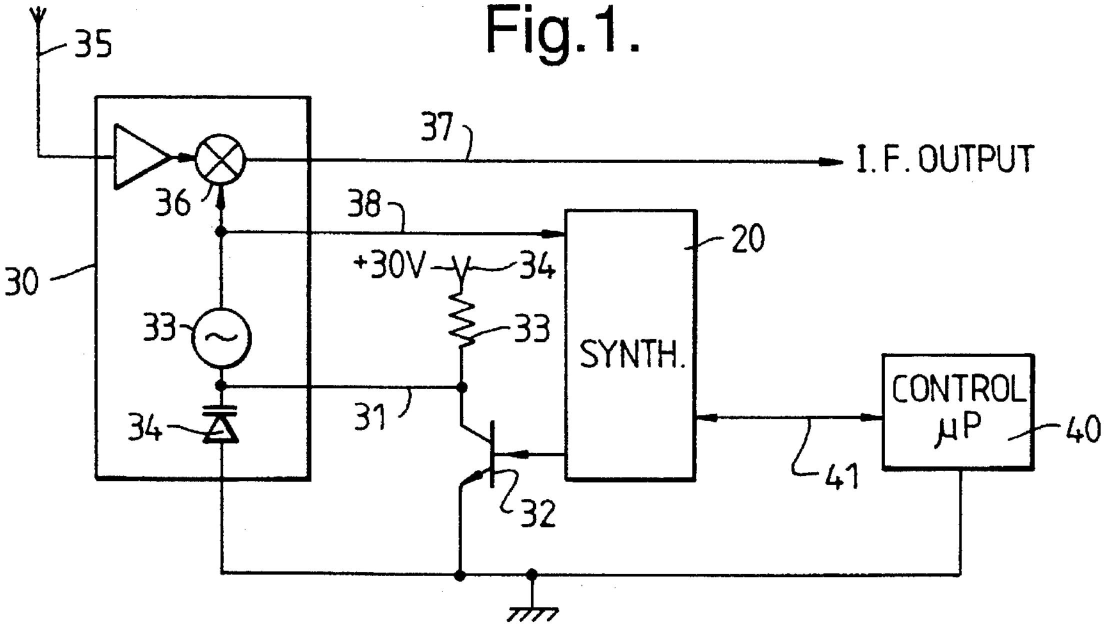
FIG. 1 is a schematic drawing of a frequency synthesizer incorporating a conventional varactor drive arrangement.
Figure 2:
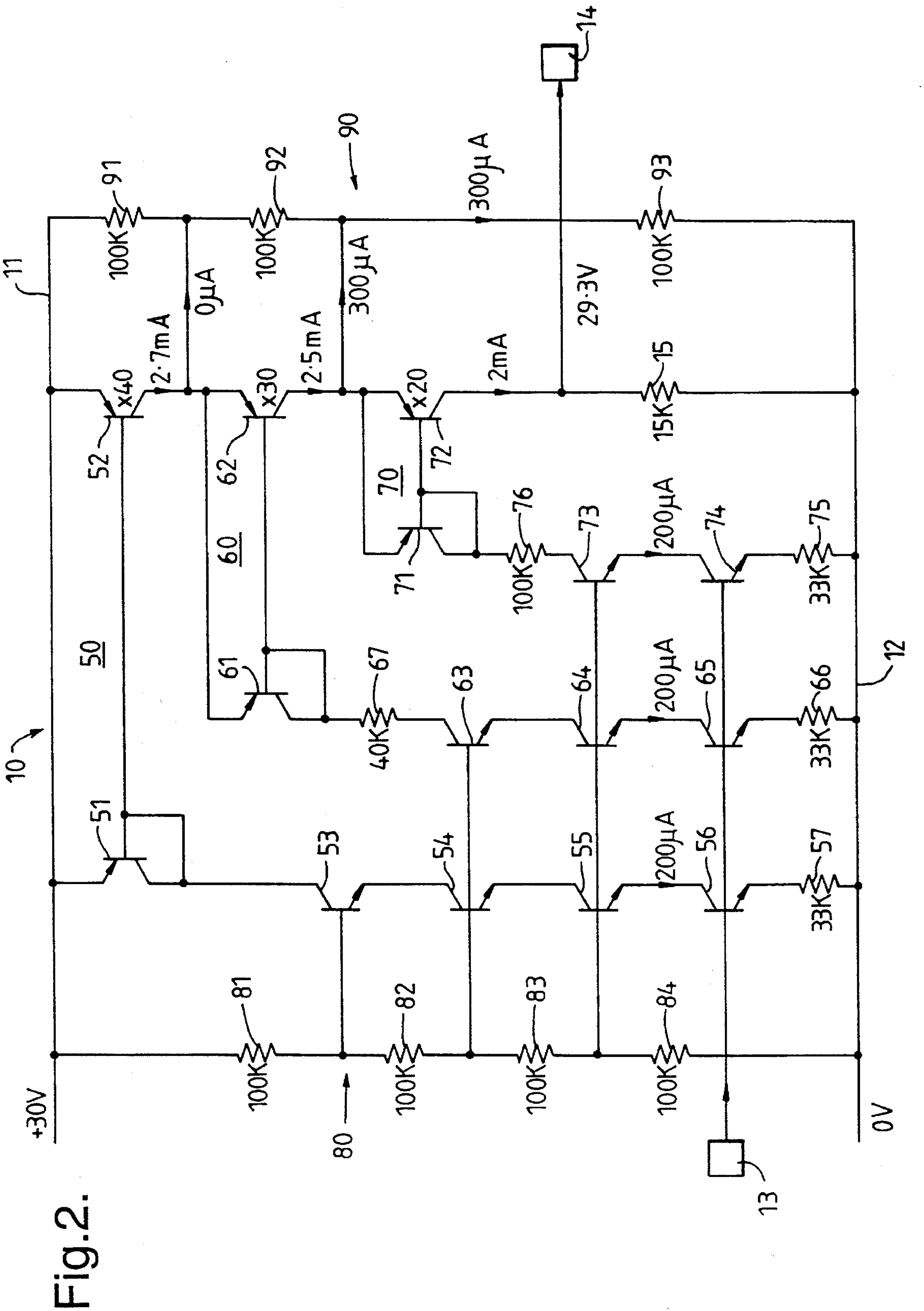
FIG. 2 is a schematic drawing of a drive circuit according to the invention.

Referring now to FIG. 2, a varactor drive circuit 10 for performing the function of the transistor-resistor arrangement 32, 33 and for integration into the synthesizer chip 20 in FIG. 1 is illustrated. The drive circuit 10 comprises three current mirrors 50, 60, 70 consisting of pnp transistors 51 and 52, 61 and 62, and 71 and 72, respectively. The output halves of the current mirrors, i.e. output transistors 52, 62 and 72, are connected in series between a high-voltage supply rail (e.g. 30 V) 11 and a zero-volt rail 12 via a load resistor 15. The input half of each current mirror, i.e. diode-connected driving transistors 51, 61 and 71, is current-fed through a totem pole arrangement of npn input transistors 53–56, 63–65 and 73, 74, corresponding bases of which are commoned, all commoning connections but that most remote from the driving transistors being taken to the respective tapping points of a potential divider 80. Divider 80 comprises equal-value resistors 81–84 and is connected between the two supply rails. Likewise, the junctions formed by the collector-emitter connections in the mirror transistors 52, 62, 72 are taken to the tapping points of a further potential divider 90, consisting of equal-value resistors 91–93. This divider is likewise connected across the supply rails. Finally, the lowest in each group of input transistors, i.e. transistors 56, 65 and 74, is coupled to the zero-volt rail 12 by way of a resistor 57, 66, 75, these resistors being likewise of equal value, and the commoned bases of transistors 56, 65, 74 are arranged to form the input 13 of the drive circuit, while the output 14 of the drive circuit is taken from across the load resistor 15.

In operation, an input voltage on line 13 from circuitry within the synthesizer chip sets up a particular current in each of the totem-pole chains 53–56, 63–65 and 73–74. Since resistors 57, 66 and 75 are the same value, the three currents set up are equal. In the preferred embodiment, it is desired to range the output voltage across resistor 15 all the way from zero volts to as near +30 V as possible. This requires the output transistors 52, 62, 72 to saturate at the highest setting of the output voltage, and to achieve this it is necessary to employ high ratios of emitter area between the transistor pairs of each current mirror. Thus, transistor 52 has an emitter area forty times that of transistor 51, transistor 62 thirty times that of transistor 61, and transistor 72 twenty times that of transistor 71. Ideally, this would have the result that, whatever current was set up in the diode-connected halves of the mirrors (transistors 51, 61 and 71), 40 times, 30 times and 20 times that current would be mirrored in .the output halves, transistors 52, 62, 72, respectively. However, in practice, because the current gain (β) of the transistors produced by the manufacturing process envisaged is very low, typically 20–40, the base currents in the mirrors are not negligible and have the effect of lessening the actual current ratios achieved. Thus, to ensure that the output transistors will saturate, it is necessary to employ very high mirror ratios. The actual current multiplication achieved for the emitter ratios employed worsens the higher these emitter ratios are.

When the input voltage on line 13 is sufficiently low, the currents in the input transistors 53–56, 63–65 and 73–74 will be substantially zero, leading to zero current through the output transistors 52, 62, 72 and zero volts on line 14. As the input voltage rises, more and more current is sunk through the input transistors 56, 65, 74 and the voltage on line 14 likewise rises. There is therefore a non-inverting relationship between input and output voltage. At the other limit of operation, the input on line 13 will be high enough to generate sufficient current in the output transistors to send these transistors into saturation. When that occurs, the voltage on line 14 will be approximately 29.3 V.

Typical resistance values are shown in FIG. 2, namely 100 k for all the divider resistors and 15k for resistor 15. The value for resistors 57, 66 and 75 will be determined by the voltage range to be expected at the input 13 from the rest of the synthesizer circuit, and will be typically 33 k. Resistors 67 and 76 serve to limit the $V_{CE}$'s of transistors 63 and 73 when the mirror output transistors go into saturation and are 40 k and 100 k, respectively. Also shown are typical currents obtaining at saturation point, i.e. 200 μA through each of the input chains 53–56, 63–65 and 73–74, 2.7 mA through transistor 52, 2.5 mA through transistor 62 and approximately 2 mA through transistor 72 and load resistor 15. A 300 μA excess current is sunk in resistor 93, lifting the collector of transistor 62 up to virtually 30 V, while the almost 2 mA of current flowing through resistor 15 brings the output voltage for the circuit up to almost the same potential.

In practice, since the drive circuit composed of transistor 32 and resistor 33 in FIG. 1 is an inverting arrangement, whereas the drive circuit shown in FIG. 2 is a non-inverting arrangement, some form of inverter stage (not shown) is necessary as an interface between the drive circuit input and the rest of the synthesizer chip.

Figure 3:
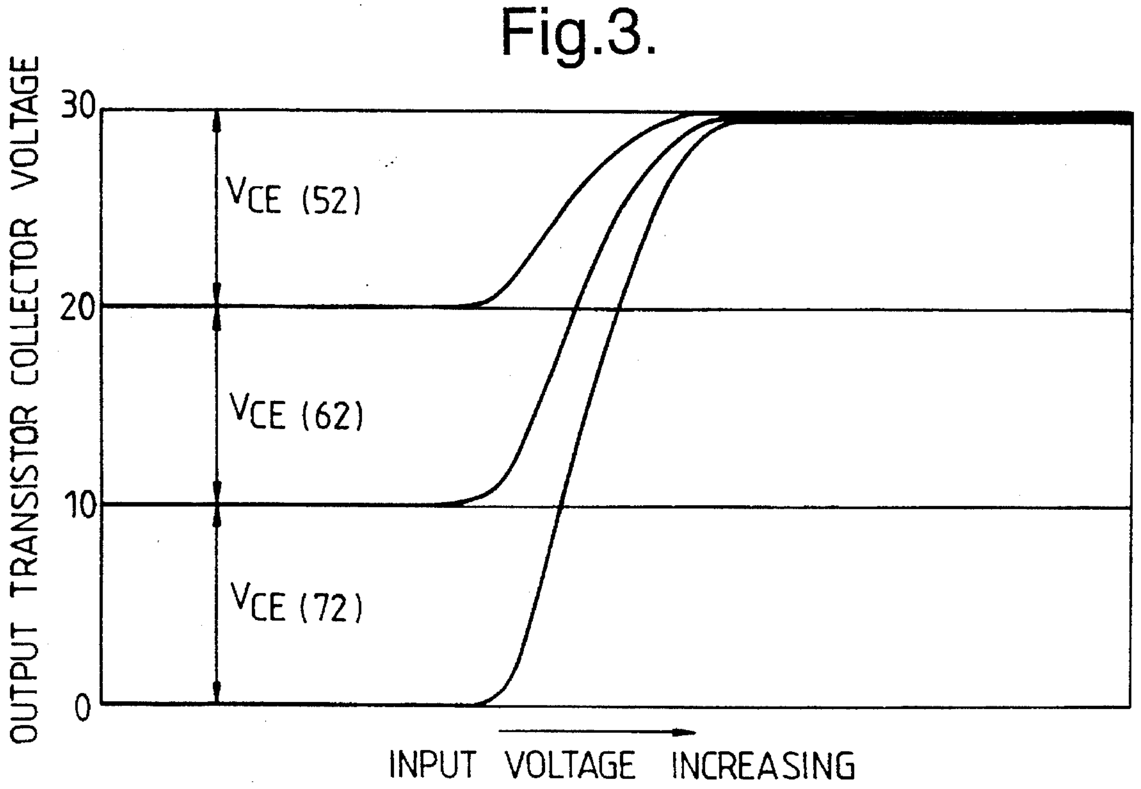
FIG. 3 is a graph of output transistor collector voltage against increasing drive circuit input voltage for the drive circuit according to the invention.

The effect of the output divider chain 90 on the collector-emitter voltages of the output transistors 52, 62, 72 can be seen in FIG. 3, which is a graph of output transistor collector voltage against drive circuit input voltage (undimensioned) for all three output transistors. It is clear from FIG. 3 that when the input 13 is zero, all three output transistors are cut off and current through the divider chain 90 establishes substantially equal voltages ($V_{CE}$) across their collector and emitter. This voltage is limited to 10 V for the 30 V supply rail shown. As the input voltage rises, more and more current is caused to flow through the output transistors, their $V_{CE}$'s consequently decreasing, until eventually saturation is reached, at which point $V_{CE}$ for all three transistors is almost zero (in practice, about 0.2 V).

The input divider chain 80 can be seen from FIG. 2 to be responsible for clamping the $V_{CE}$'s of the input-current transistors 53–55, 63–64 and 73 to a value of around 7.5 V; transistors 56, 65 and 74 have an even smaller $V_{CE}$ than this when they are supplying non-zero current, by virtue of the emitter resistors 57, 66 and 75.

I claim:

1. A drive circuit comprising first and second power supply rails; a plurality of output transistors, each output transistor having first and second main terminals and a control terminal, said output transistors being connected in series at their main terminals between the first and second power supply rails by way of a load element; a like plurality of driving circuit means for applying driving signals to said control terminals of respective output transistors in dependence upon respective input currents to said driving circuit means, said driving circuit means being arranged such as to allow the respective output transistor control terminal to float in dependence upon an output voltage established across said load element; a like plurality of input means arranged to establish an input current in respective ones of said driving circuit means in dependence upon an input signal to said drive circuit, thereby to establish a desired output voltage across said load element, each of said input means comprising at least one input transistor having first and second main terminals and a control terminal; first and second biasing means connected between said first and second power supply rails, and means connecting said first and second biasing means to said output transistors and said input means, respectively, to apply to said main terminals of said output transistors, and to main terminals of input transistors within said input means, respectively, voltages intermediate those of said first and second power supply rails, such that voltages appearing across the main terminals of the respective transistors are less than a rated voltage for said transistors.

2. A drive circuit according to claim 1, in which each of said driving circuit means comprises a driving transistor connected to its respective output transistor in a current-mirror configuration.

3. A drive circuit according to claim 2, in which the load element is connected to the second power supply rail and each of said input means comprises a group of input transistors connected in series at their main terminals, each of said groups of input transistors being connected at one end to its respective driving transistor and at the other end to the second power supply rail, the combinations of input transistor group and current mirror being arranged such that the output transistors of successive current mirrors, starting from the mirror nearest the first power supply rail, pass successively less current.

4. A drive circuit according to claim 3, in which successive groups of series-connected input transistors, starting from the group associated with the current mirror nearest the load element, comprise successively one more input transistor in the series chain.

5. A drive circuit according to claim 4, in which those input transistors which are connected to the second power supply rail are commoned together at their control terminals, the commoned control terminals forming an input of the drive circuit for receiving the input signal.

6. A drive circuit according to claim 5, in which corresponding remaining transistors in the groups of input transistors have their control terminals commoned together and connected to the second biasing means.

7. A drive circuit according to claim 6, in which the first and second biasing means comprise first and second potential divider chains, respectively, the first divider chain having a plurality of dividing elements corresponding to the plurality of output transistors, the plurality of dividing elements forming corresponding tapping points, the tapping points being connected to respective main-terminal junctions of the plurality of output transistors, and the second divider chain having a plurality of dividing elements corresponding to the number of series-connected input transistors in the largest group of input transistors, the plurality of dividing elements forming corresponding tapping points, the tapping points being connected to respective commoned control terminals of the groups of input transistors.

8. A drive circuit according to claim 7, in which those input transistors which are connected to the second power supply rail are connected to that rail by way of respective resistive impedances.

9. A drive circuit according to claim 8, in which the input transistors, the driving transistors and the output transistors are bipolar transistors.

10. A drive circuit according to claim 9, in which the driving transistors and the output transistors are bipolar transistors of one polarity type, while the input transistors are bipolar transistors of the opposite polarity type.

11. A drive circuit according to claim 10, in which successive current mirrors, starting from the current mirror nearest the load element, have successively higher ratios of emitter area.

12. A drive circuit according to claim 11, in which there are three output transistors and the mirror ratios are 20:1, 30:1 and 40:1, respectively.

13. A drive circuit according to claim 12, in which the dividing elements in the first divider chain are of equal impedance value and the dividing elements in the second divider chain are of equal impedance value.

* * * * *